(12) United States Patent
Steigerwald et al.

(10) Patent No.: US 8,334,184 B2
(45) Date of Patent: Dec. 18, 2012

(54) POLISH TO REMOVE TOPOGRAPHY IN SACRIFICIAL GATE LAYER PRIOR TO GATE PATTERNING

(75) Inventors: Joseph M. Steigerwald, Forest Grove, OR (US); Uday Shah, Portland, OR (US); Seiichi Morimoto, Beaverton, OR (US); Nancy Zelick, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 13 days.

(21) Appl. No.: 12/646,450

(22) Filed: Dec. 23, 2009

(65) Prior Publication Data

US 2011/0147812 A1    Jun. 23, 2011

(51) Int. Cl.
*H01L 21/336* (2006.01)
*H01L 21/70* (2006.01)

(52) U.S. Cl. ........ 438/294; 438/183; 438/197; 257/407; 257/E21.444; 257/E21.453

(58) Field of Classification Search .................. 438/183, 438/294, 197; 257/E21.444, E21.453, 407
See application file for complete search history.

(56) References Cited

U.S. PATENT DOCUMENTS

| 2005/0153492 | A1* | 7/2005 | Ahmed et al. ............... 438/183 |
| 2008/0157130 | A1 | 7/2008 | Chang |
| 2008/0220585 | A1* | 9/2008 | Watanabe et al. ............ 438/424 |
| 2009/0321836 | A1* | 12/2009 | Wei et al. ..................... 257/365 |

\* cited by examiner

*Primary Examiner* — Ha Tran T Nguyen
*Assistant Examiner* — Aaron Dehne
(74) *Attorney, Agent, or Firm* — Winkle, PLLC

(57) ABSTRACT

Techniques are disclosed for fabricating FinFET transistors (e.g., double-gate, trigate, etc). A sacrificial gate material (such as polysilicon or other suitable material) is deposited on fin structure, and polished to remove topography in the sacrificial gate material layer prior to gate patterning. A flat, topography-free surface (e.g., flatness of 50 nm or better, depending on size of minimum feature being formed) enables subsequent gate patterning and sacrificial gate material opening (via polishing) in a FinFET process flow. Use of the techniques described herein may manifest in structural ways. For instance, a top gate surface is relatively flat (e.g., flatness of 5 to 50 nm, depending on minimum gate height or other minimum feature size) as the gate travels over the fin. Also, a top down inspection of gate lines will generally show no or minimal line edge deviation or perturbation as the line runs over a fin.

17 Claims, 7 Drawing Sheets

POLISH TO REMOVE TOPOGRAPHY IN SACRIFICIAL GATE LAYER PRIOR TO GATE PATTERNING

BACKGROUND

A FinFET is a transistor built around a thin strip of semiconductor material (generally referred to as the fin). The transistor includes the standard field effect transistor (FET) nodes, including a gate, a gate dielectric, a source region, and a drain region. The conductive channel of the device resides on the outer sides of the fin beneath the gate dielectric. Specifically, current runs along both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a trigate FinFET. Other types of FinFET configurations are also available, such as so-called double-gate FinFETs, in which the conductive channel principally resides only along the two sidewalls of the fin (and not along the top of the fin).

There are a number of non-trivial issues associated with fabricating FinFETs, which limits the applications for which FinFET processing can be employed.

DETAILED DESCRIPTION

Figure 1:
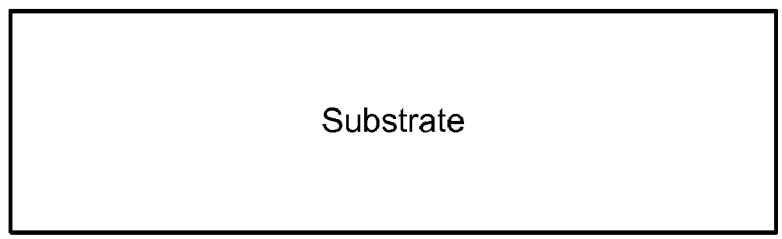
FIGS. 1 through 6 illustrate fin formation, in accordance with an embodiment of the present invention.

Techniques are disclosed for fabricating FinFET transistors (e.g., double-gate, trigate, etc). The techniques involve polishing the sacrificial gate material after fin formation, but before gate patterning and transistor formation. The transistors can be implemented in any number of semiconductor materials, including silicon (Si), germanium (Ge), silicon germanium (SiGe), and III-V material systems.

General Overview

As previously stated, there are a number of non-trivial issues associated with fabricating FinFETs. For example, the topography generated by FinFET transistor flows tends to cause poor gate patterning, thereby resulting in gate line edge roughness. In particular, the gate pattern cannot be resolved, as there are multiple depths of focus due to the topography (i.e., only part of the pattern can be seen at any one focal plane). Topography in the gate layer also prevents successful gate opening, for example, during planarization in a replacement metal gate (RMG) flow.

Thus, and in accordance with an embodiment of the present invention, a sacrificial gate material (such as polysilicon or other suitable material) is deposited over fin structures formed in a substrate, and then polished to remove topography in the sacrificial gate material layer prior to gate patterning. A flat, topography-free surface enables subsequent gate patterning (at a single depth of focus) and sacrificial gate material opening (via polishing) in a FinFET process flow. Any number of sacrificial gate materials can be used here, other than polysilicon. For instance, in an RMG process flow, materials such as silicon nitride and silicon carbide may be used for gate patterning, since this material is sacrificial in that it is eventually replaced by metal. In this sense, an embodiment of the present invention includes polishing of any material used as sacrificial gate material in an RMG process flow for FinFET transistors, prior to gate patterning. Note, however, that non-RMG process flows can also benefit from such a post fin formation polish of gate layer material prior to gate patterning, as will be appreciated in light of this disclosure.

Once the fins are formed and polishing of the sacrificial gate material is complete, a FinFET transistor process flow can be executed to fabricate, for instance, high k metal gate transistors. Any number of transistor types and/or formation process flows may benefit from pre-gate patterning planarization of a sacrificial gate material (e.g., n-channel metal oxide semiconductor or NMOS transistors, p-channel metal oxide semiconductor or PMOS transistors, or both PMOS and NMOS transistors within the same flow, whether configured with thin or thick gates, and with any number of geometries). Likewise, numerous material systems can benefit from the techniques described herein, as will be apparent in light of this disclosure, and the claimed invention is not intended to be limited to any particular one or set. Rather, the techniques can be employed wherever fin-induced topography is an issue, and can be resolved with a pre-gate patterning polish of sacrificial gate material.

The techniques can be embodied, for example, in any number of integrated circuits, such as memories and processors and other such devices that are fabricated with transistors and other active junction semiconductor devices, as well as in methodologies suitable for practice at fabs where integrated circuits are made. Use of the techniques described herein may manifest in various structural ways. For instance, a cross-section image of transistor gates formed in accordance with an embodiment of the present invention, such as an image provided with a scanning or transmission electron microscope (SEM or TEM), demonstrate a top gate surface that is relatively flat as the gate travels over the fin, as compared to a conventional FinFET fabrication. Also, a top down inspection of gate lines generally shows no or minimal line edge deviation or perturbation as the line runs over a fin, thereby indicating a flat surface at the time of gate patterning.

Fin Structure

FIGS. 1 through 6 illustrate formation of a fin structure configured in accordance with an embodiment of the present invention. Each of the views shown is a cross-sectional side view, wherein the cross-section is parallel to the fins.

As can be seen in FIG. 1, a substrate is provided. The substrate can be, for example, a blank substrate that is to be prepared for subsequent semiconductor processes by forming a number of fin structures therein. Alternatively, the substrate can be a partially formed semiconductor structure upon which, for instance, drain, source, and gate regions are to be formed using at least one fin structure.

Any number of suitable substrates can be used here, including bulk substrates, semiconductors on insulator substrates (XOI, where X is a semiconductor material such as Si, Ge or Ge-enriched Si), and multi-layered structures, and particularly those substrates upon which fins are formed prior to a subsequent gate patterning process. In one specific example case, the substrate is a Si bulk substrate. In another specific example case, the substrate is a Ge contact layer of transistor growth structure. Any number of configurations can be used, as will be apparent.

Figure 2:
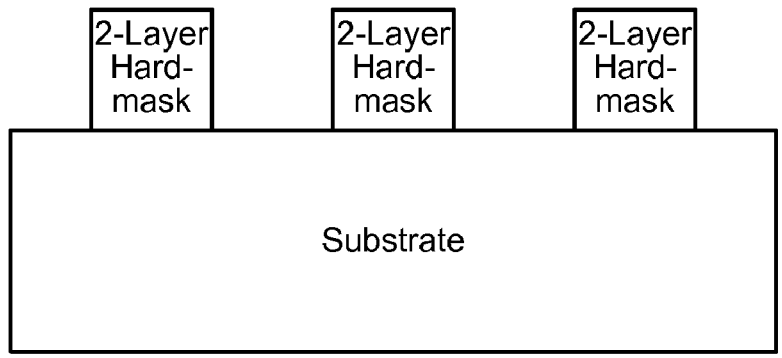

FIG. 2 illustrates deposition and patterning of a two-layer hardmask on the substrate of FIG. 1, in accordance with one embodiment of the present invention. This can be carried out using standard photolithography, including deposition of hardmask materials (e.g., such as silicon dioxide, silicon nitride, and/or other suitable hardmask materials), patterning resist on a portion of the hardmask that will remain temporarily to protect an underlying region of the fin (such as a diffusion or active area of a transistor device), etching to remove the unmasked (no resist) portions of the hardmask (e.g., using a dry etch, or other suitable hardmask removal process), and then stripping the patterned resist material, thereby leaving the patterned mask as shown.

In the example embodiment shown in FIG. 2, the resulting hardmask is a standard two-layer hardmask configured with a bottom layer of oxide and top layer of silicon nitride, and includes three locations, but in other embodiments, the hardmask may be configured differently, depending on the particular active device being fabricated. In one specific example embodiment having a Si substrate, the hardmask is implemented with a bottom layer of native oxide (oxidation of Si substrate) and top layer of silicon nitride. Any number of hardmask configurations can be used, as will be apparent.

Figure 3:
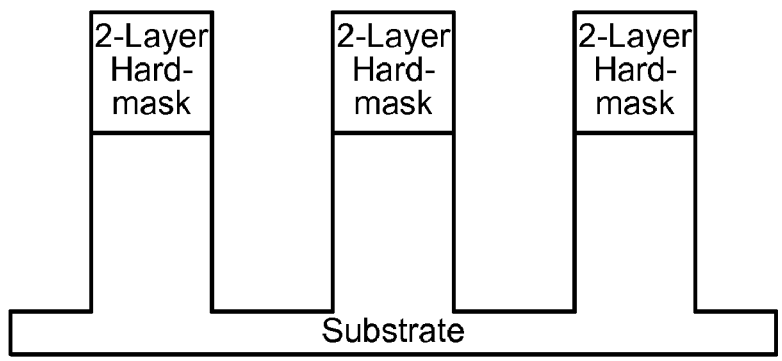

As can be seen in FIG. 3, shallow trenches are etched into the substrate. The shallow trench etch can be accomplished with standard photolithography include wet or dry etching, or a combination of etches if so desired. The geometry of the trenches (width, depth, shape, etc) can vary from one embodiment to the next as will be appreciated, and the claimed invention is not intended to be limited to any particular trench geometry. In one specific example embodiment having a Si substrate and a two-layer hardmask implemented with a bottom oxide layer and a top silicon nitride layer, a dry etch is used to form the trenches that are about 100 Å to 5000 Å below the top surface of the substrate. Any number of trench configurations can be used, as will be apparent.

Figure 4:
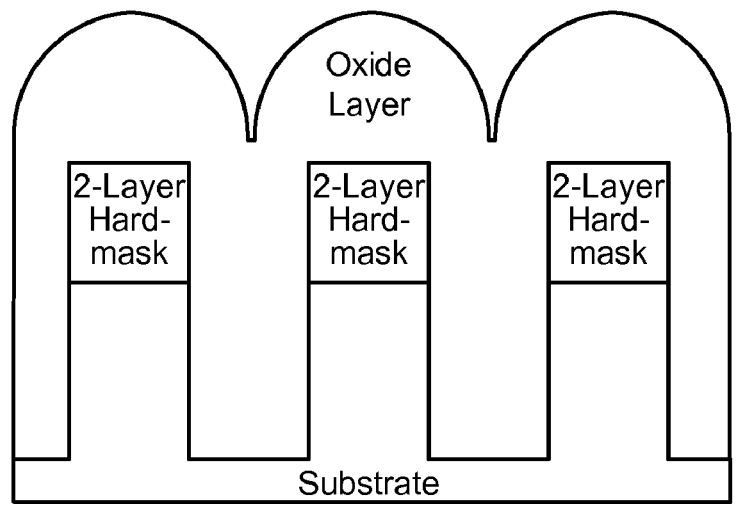

As can be seen in FIG. 4, the trenches are subsequently filled with an oxide material (or other suitable dielectric material), using any number of standard deposition processes. In one specific example embodiment having a Si substrate, the deposited oxide material is $SiO_2$, but any number suitable isolation oxides/dielectric materials can be used to form the shallow trench isolation (STI) structures here. In general, the deposited or otherwise grown isolation oxide/dielectric material for filling the trenches can be selected, for example, based on compatibility with the native oxide of the substrate material. Note that the gate trench may be circular or polygonal in nature, and any reference to trench 'sides' is intended to refer to any such configurations, and should not be interpreted to imply a particular geometric shaped structure. For instance, trench sides may refer to different locations on a circular-shaped trench or discrete sides of a polygonal-shaped trench or even different locations on one discrete side of a polygonal-shaped trench. In a more general sense, trench 'surfaces' refers to all such trench sides as well as the base (bottom) of the trench.

Figure 5:
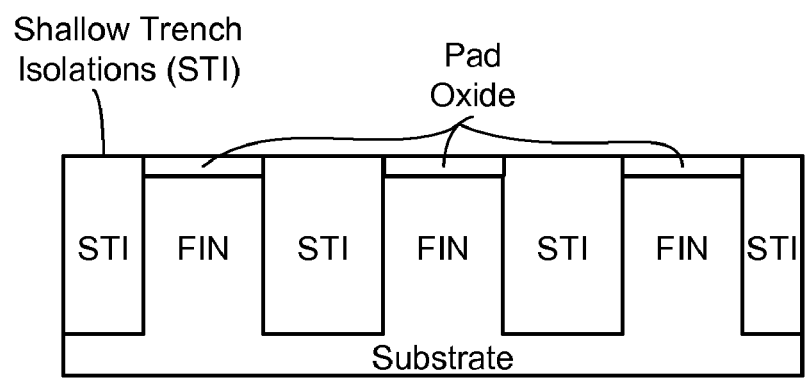

FIG. 5 demonstrates how the isolation oxide (or other suitable dielectric material) is planarized using, for example, CMP or other suitable process capable of planarizing the structure. In the specific example embodiment shown, the planarization leaves a portion of the first layer of the hardmask (generally designated in FIGS. 5-11 as pad oxide), which can be used as a gate oxide. In other embodiments, the pad oxide can be completely removed, and a dummy oxide can be deposited before putting down the sacrificial gate material. In other embodiments, a high-k dielectric material can be deposited for the gate oxide at this time (or later in the process), as is sometimes done.

Figure 6:
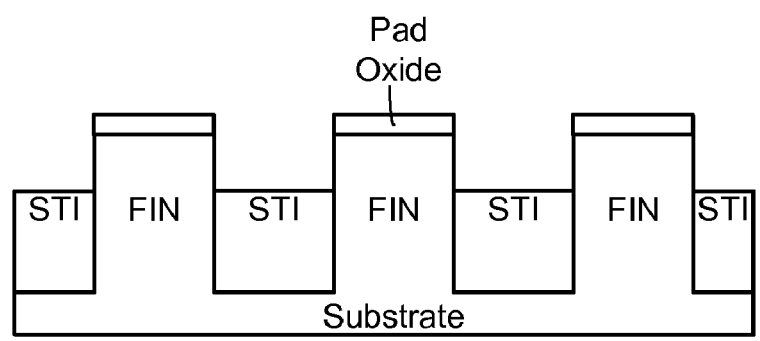

FIG. 6 demonstrates how the structure is further patterned, so that the isolation oxide/dielectric material in the STIs can be etched, so as to recess the STI isolation oxide/dielectric material below the fin structures. These recessed regions provide isolation for the source/drain regions of the transistor. In one specific example embodiment having a Si substrate, the planarized and etched STI oxide material is $SiO_2$.

The resulting structure can include any number of fins (one or more), isolated by any suitable isolation material. This example fin structure depicted in FIGS. 1-6 is fabricated using photolithography as typically done. In other embodiments, note that the fins can be epitaxially grown as is sometimes done, such as described in U.S. Patent Application Publication No. 2008/0157130, titled, "Epitaxial Fabrication of Fins for FinFET Devices." In such cases, the fin is effectively formed as a layer in the manufacturing process. By forming a fin layer, fin thickness is determined through control of the process parameters used to form the fin layer rather than photolithographic processes. For instance, if the fin is grown with an epitaxial process, the fin's thickness will be determined by the growth dynamics of the epitaxy. FinFETs whose fin widths are determined through layer formation rather than photolithography may offer improved minimum feature sizes and packing densities. In other embodiments, the fins can be fabricated by removal of material by cutting or ablation, for example, using laser, or other suitable tools capable of fine-cutting semiconductor materials. Resulting fin geometries will generally vary depending on formation techniques employed.

Deposition and Polish of Sacrificial Gate Material

Figure 7:
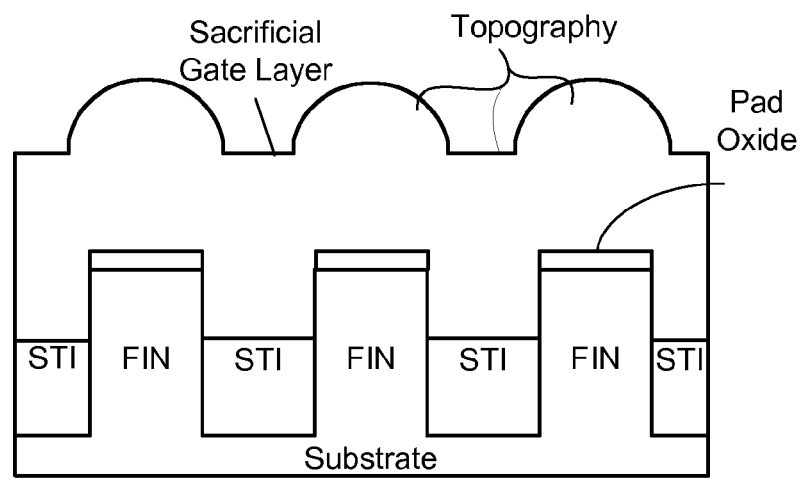
FIG. 7 illustrates deposition of a sacrificial gate material on the fins fabricated in FIGS. 1-6, in accordance with an embodiment of the present invention.

FIG. 7 illustrates a deposition of a sacrificial gate material on the fins fabricated in FIGS. 1-6, in accordance with an embodiment of the present invention. The deposition can be carried out, for example, using chemical vapor deposition or other suitable process. In one specific example embodiment having an Si substrate, the planarized and etched STI oxide material is $SiO_2$, and the sacrificial gate material is polysilicon. As previously explained, the sacrificial gate material can be any suitable sacrificial material (e.g., polysilicon, silicon nitride, silicon carbide, etc), depending on the device being formed, process flow involved, and the material systems employed. In any case, given the nature of the underlying fins and recesses, the deposited sacrificial gate material is associated with a surface that rises and falls respectively with the fins and recesses (generally designated in FIG. 7 as topography). As previously explained, such topography causes a number of problems.

Figure 8A:
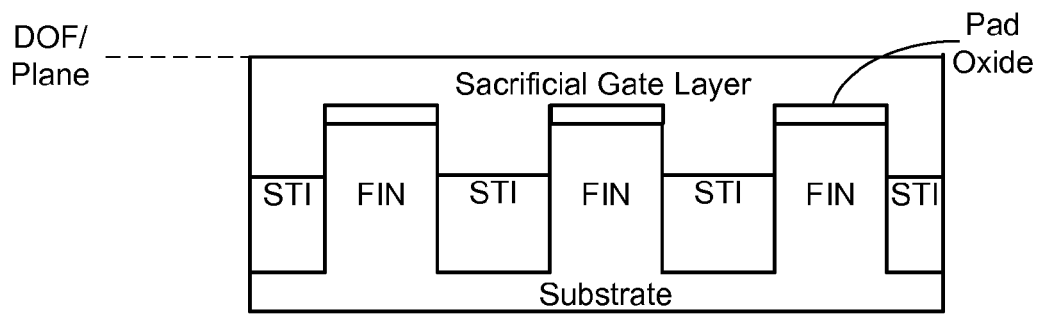
FIG. 8a illustrates polishing of the sacrificial gate material deposited in FIG. 7, in accordance with an embodiment of the present invention.
Figure 8B:
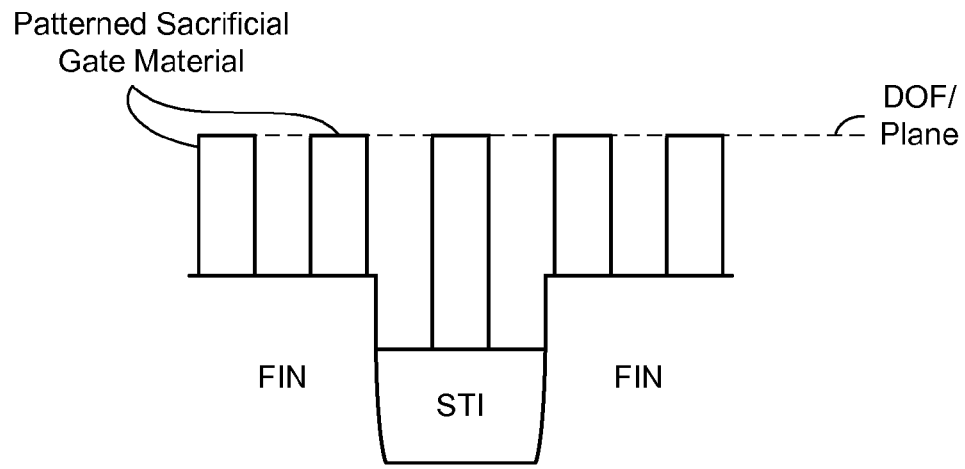
FIG. 8b illustrates patterning of the sacrificial gate material deposited in FIG. 7, in accordance with an embodiment of the present invention.

FIG. 8a illustrates polishing of the sacrificial gate material deposited in FIG. 7, in accordance with an embodiment of the present invention. In one specific example embodiment, this polishing is carried out using CMP. However, other embodiments may achieve a planar sacrificial gate material sacrificial gate material layer by other techniques such as spin-on dielectric plus etching or a reverse mask plus etching, or a combination of etching and CMP. In any such cases, note the plane (generally shown with a dashed line in FIG. 8a) at the polished surface, which effectively defines a single depth of focus (DOF) for subsequent gate patterning of the sacrificial gate material, as best shown in FIG. 8b. The patterned gate material can then be used, for instance, for transistor formation (e.g., gate, source, and drain regions of a FinFET device). Note that, despite the subsequent removal of the sacrificial gate material, the plane defining the single DOF remains (across the top of the gate trenches, which will generally be located where the sacrificial gate material is located, as shown in FIG. 8b). Contact metal may be deposited thereon.

Figure 8C:
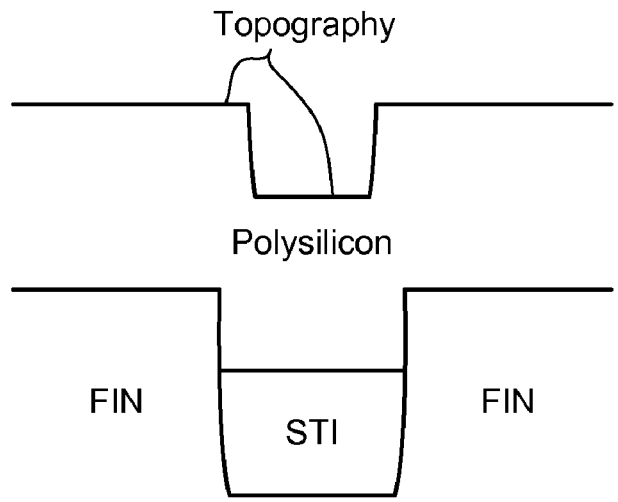
FIGS. 8c and 8d illustrate the effect of topography on gate pattering.
Figure 8D:
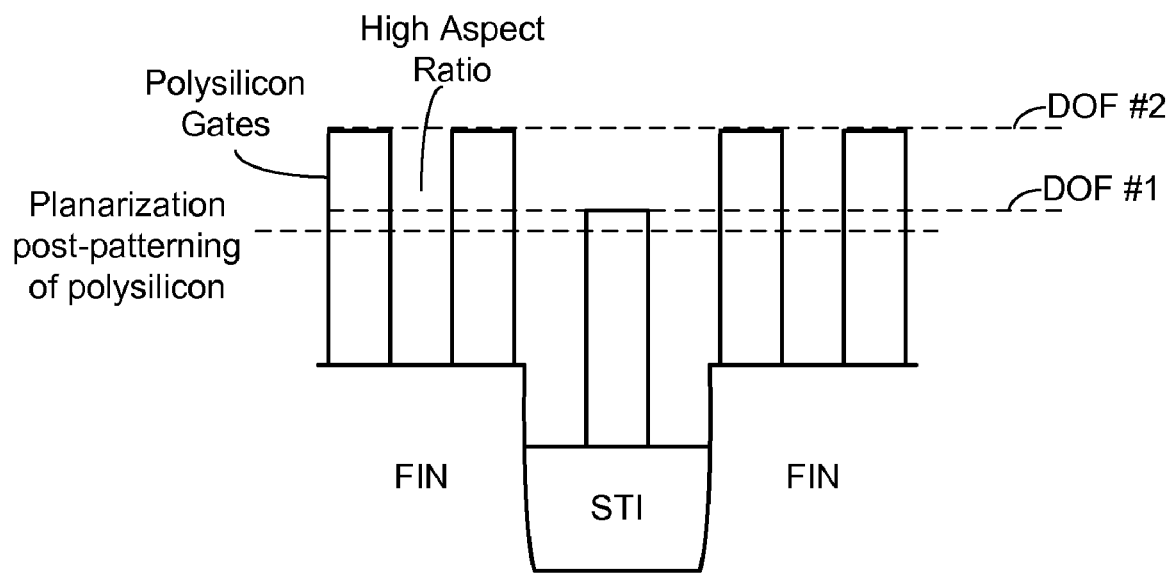

In contrast, FIGS. 8c and 8d show how topography in the sacrificial layer causes multiple depths of focus (e.g., DOF #1 and DOF #2, as shown in FIG. 8d), which make gate patterning very difficult. In particular, given the geometries involved (e.g., on the order of 10 to 100 nm features, depending on the process technology employed), the gate pattern cannot be resolved at any one focal plane; thus, multiple focal planes would be necessary. Alternatively, the multiple DOF issue could be ignored and the patterning quality would suffer accordingly, thereby yielding non-flat gate features running over the fins (e.g., more than 20 nm of divergence between high and low points of a given gate feature surface). In addition, note the high aspect ratio of the lines etched between the patterned sacrificial gate material (which is polysilicon in this example). Such lines are difficult to etch with a straight profile, and are also difficult to fill with inter-layer dielectric material. Note that establishing, prior to gate patterning (or pre-gate-patterning), a plane defining a single DOF (as shown in FIGS. 8a and 8b), in accordance with an embodiment of the present invention, eliminates or otherwise mitigates such problems.

As will be appreciated, the view shown in each of FIGS. 7 and 8a-d is a cross-sectional side view, wherein the cross-section is parallel to the fins.

Gate Patterning and Transistor Formation

FIGS. 9 through 12 illustrate a transistor formation and an RMG process flow, in accordance with an embodiment of the present invention. As can be seen, one transistor is shown, any number of transistors can be formed using the same process, as will be appreciated. In addition, the transistors formed may be implemented in a number of configurations (e.g., PMOS, NMOS, or both such as the case in complementary pair formation). In short, the techniques provided herein can be used with any type of transistor technology or configuration, and the claimed invention is not intended to be limited to any particular transistor type or configuration.

Figure 9:
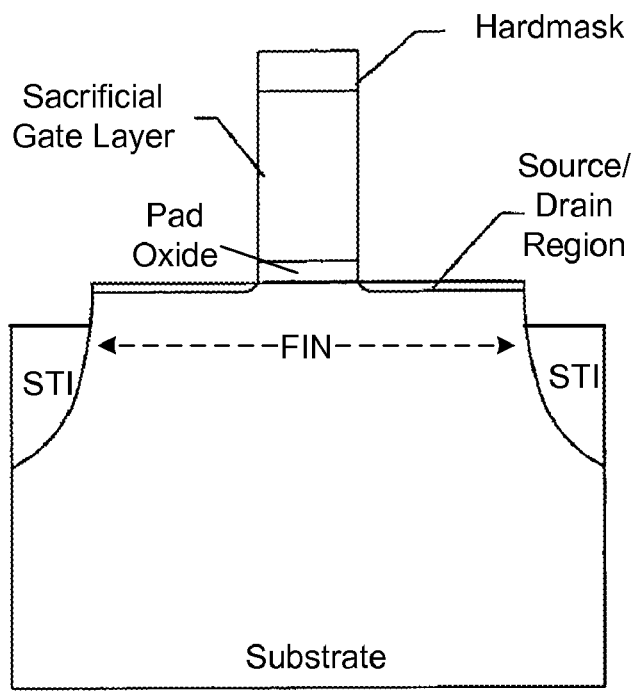
FIGS. 9 through 12 illustrate transistor formation and an RMG process flow, in accordance with an embodiment of the present invention.

FIG. 9 illustrates gate patterning of the sacrificial gate material, in accordance with one specific example embodiment of the present invention. As previously explained with reference to FIG. 8b, this patterning can be carried out from a single depth of focus, due to the pre-patterning planarization of the sacrificial material layer. This patterning can be carried out using standard photolithography, including deposition of hardmask materials (e.g., such as silicon dioxide, silicon nitride, and/or other suitable hardmask materials) on the sacrificial gate material, patterning resist on a portion of the hardmask that will remain temporarily to protect the underlying gate region of the device, etching to remove the unmasked (no resist) portions of the hardmask (e.g., using a dry etch, or other suitable hardmask removal process), and then stripping the patterned resist, thereby leaving the patterned gate mask. In one specific example embodiment having a Si substrate, the hardmask is implemented with silicon nitride (e.g., 100 Å to 500 Å thick). Any number of suitable hardmask configurations can be used, as will be apparent in light of this disclosure.

Once the hardmask is complete, etching is carried out to remove the non-masked sacrificial gate material (and any remaining pad or dummy oxide) down to the substrate and slightly into the substrate to form the source/drain regions, as commonly done. The etching can be accomplished with standard photolithography include, for example, dry etching or any suitable etch process or combination of etches. Note that the source/drain regions may be formed using the gate structure as a mask. Ion implantation may be used to dope the source/drain regions as conventionally done.

The geometry of the resulting gate structure (e.g., width, depth, shape) as well as the shape and depth of source/drain dopant regions, can vary from one embodiment to the next as will be appreciated, and the claimed invention is not intended to be limited to any particular device geometries. As previously explained, this gate patterning can be used to simultaneously produce a plurality of such structures where, for example, all the transistors to be formed will be the same, or some transistors are one type/configuration (e.g., PMOS) and the remainder are another type/configuration (e.g., NMOS).

Figure 10:
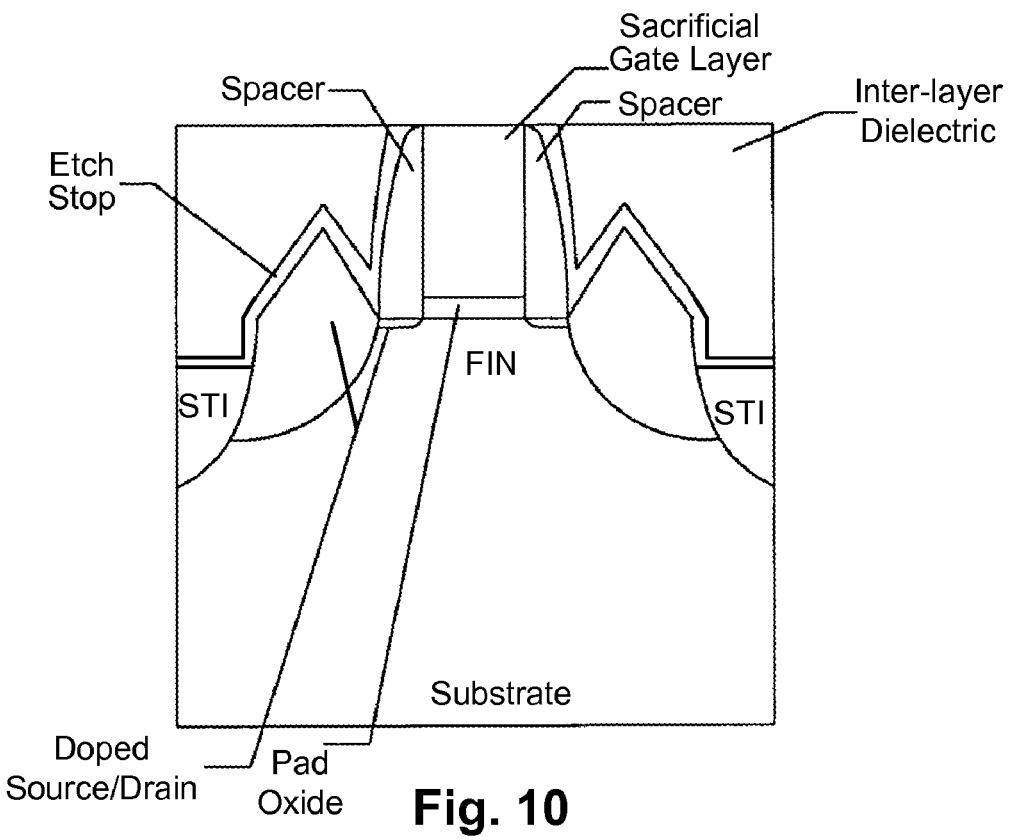

FIG. 10 illustrates a cross-sectional side view (perpendicular to the gates and parallel to the fins) of an example transistor structure formed with the patterned gate structure of FIG. 9, in accordance with one embodiment of the present invention. As can be seen, a spacer material is deposited and anisotropically etched to form sidewall spacers about the gate structure walls. The spacers may be, for example, a nitride that is deposited on the order of 50 Å to 500 Å thick.

With respect to forming a P+ doped source/drain region for PMOS (as shown), a trench is etched into the substrate (e.g., by reactive ion etching). In this example configuration, the etching is constrained on one side by the previously formed STI neighboring each source/drain region and does not substantially isotropically undercut the gate structure on the other side. As such, an isotropic etch profile may be achieved on the inward edges of the trench, while leaving a small portion of the lightly doped source/drain region (under the spacer material, as shown). Then, an epitaxial source/drain can be grown which fills the trench and extends thereabove as indicated in FIG. 10. The trench may be filled, for example, using a growth of silicon germanium having 10-40 atomic percent germanium. The source/drain doping may be done, for instance, by in-situ doping using a diborane source. The epitaxial source/drain only grows in the trench because all other material is masked or covered. The source/drain is raised and continues to grow until the facets meet. Note that if fabricating a complementary device having both PMOS and NMOS, the NMOS side can be covered by an oxide mask during PMOS doping region formation. A source/drain implant may be used in some embodiments. Other embodiments may employ only NMOS source/drain formation, which would involve N+ doped regions which are not grown above the surface. Any number of suitable source/drain materials, as well as formation and doping techniques, can be used.

After source/drain formation and doping, an etch stop layer can be deposited (to protect doped source/drain regions during subsequent etching), if necessary. An inter-layer dielectric (ILD) is then deposited over the structure. The ILD can be, for example, any suitable low dielectric constant material such as an oxide (e.g., $SiO_2$), and the etch stop layer can be, for instance, a nitride (e.g., SiN). In some cases, the ILD may be doped with phosphorus, boron, or other materials and may be formed by high density plasma deposition. The ILD may then be planarized down to the upper surface of the sacrificial gate material, thereby removing the hardmask and the etch stop (if applicable) to open the gate, as shown in FIG. 10. As will be appreciated, the optional etch stop can be helpful in fabricating NMOS devices by acting as a tensile layer, but may degrade PMOS devices by producing strain.

Figure 11:
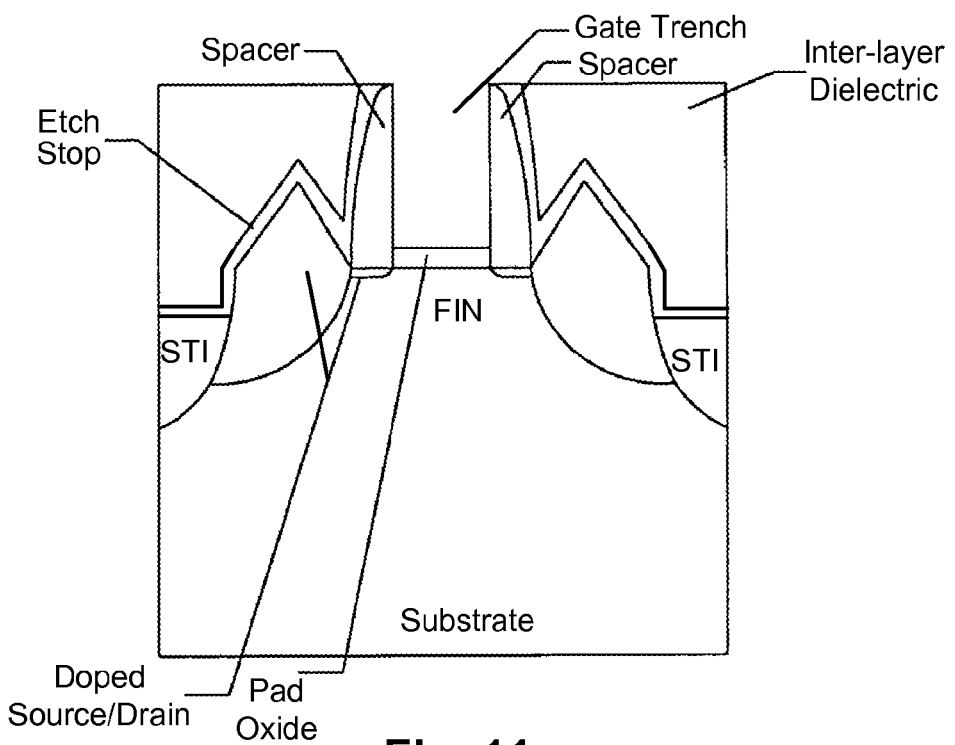

As shown in FIG. 11, the sacrificial gate material can be removed from between the spacers, thereby forming a gate trench over the remaining pad oxide. Removal of the sacrificial gate material may be done, for example, by any of a variety of suitable dry and/or wet etch techniques. In some applications having both PMOS and NMOS transistors, note that the sacrificial gate material for the NMOS and PMOS devices can be removed at the same time, or at different times using selective etching. Any number of suitable etch schemes can be used here as will be apparent.

After removing the sacrificial gate material, the pad oxide can also be removed. When the pad oxide comprises $SiO_2$, for instance, it can be removed using an etch process that is selective for $SiO_2$. Then, a high k gate dielectric can be deposited (e.g., via chemical vapor deposition or other suitable process) on the gate trench surfaces, and planarized or otherwise shaped as desired. The high k gate may comprise any suitable gate dielectric material (e.g., hafnium oxide, zirconium oxide, and aluminum oxide). Any number of suitable high k gate dielectrics and treatments can be used, as is sometimes done, depending on factors such as desired isolation.

Figure 12:
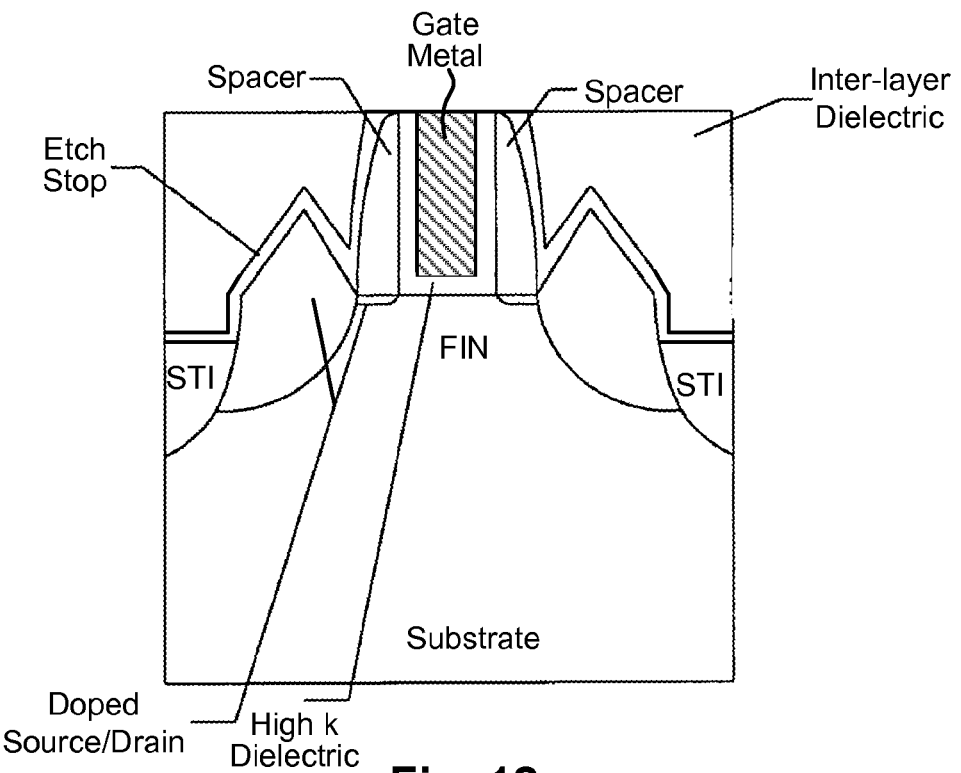

As shown in FIG. 12, a gate metal is deposited (e.g., via chemical vapor deposition or other suitable process) into the gate trench, and any excess gate metal may be planarized to form a metal gate electrode as shown. The gate metal can be, for example, titanium, platinum, gold, aluminum, titanium nickel, palladium, or other suitable gate metal or combination of such metals. As will be appreciated, the view shown in each of FIGS. 9 and 12 is a cross-sectional side view, wherein the cross-section is parallel to the fins.

Thus, FIGS. 1-12 illustrate an example transistor structure and fabrication process, wherein sacrificial gate material is deposited and polished prior to gate patterning and transistor formation. Numerous variations and modifications will be apparent in light of this disclosure. The various layers and features may be implemented with any suitable dimensions and other desired layer parameters, using established semiconductor processes (e.g., chemical vapor deposition, molecular beam epitaxy, photolithography, or other such suitable processes). In general, the specific layers and dimensions of the structure will depend on factors such as the desired device performance, fab capability, and semiconductor materials used. Specific device materials, features, and characteristics are provided for example only, and are not intended to limit the claimed invention, which may be used with any number of device configurations and material systems.

Methodology

Figure 13:
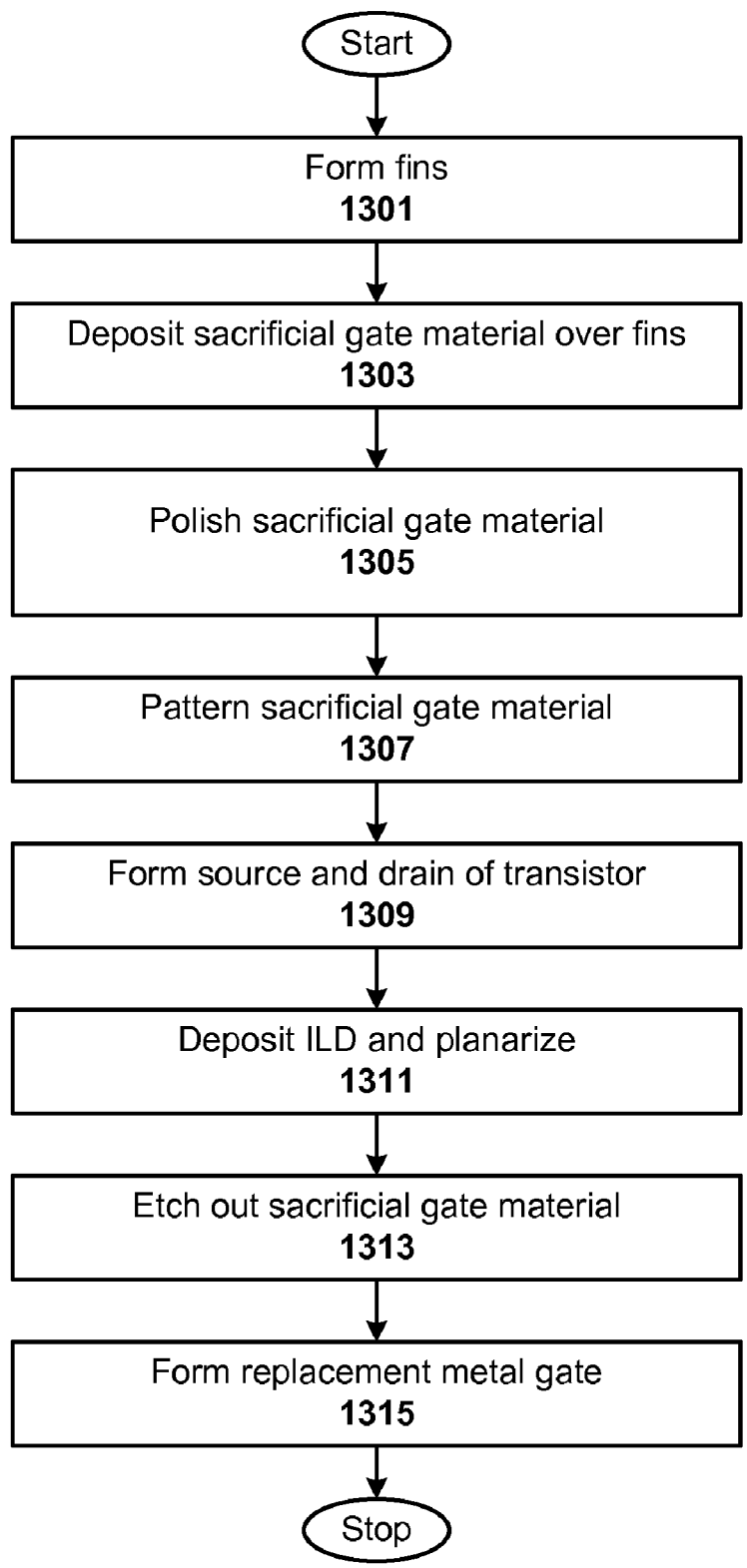
FIG. 13 illustrates a method for fabricating a FinFET transistor, in accordance with an embodiment of the present invention.

FIG. 13 illustrates a method for fabricating a FinFET transistor, in accordance with an embodiment of the present invention. The FinFET transistor can be any type (e.g., PMOS, NMOS) or configuration (e.g., double-gate, trigate), as will be appreciated in light of this disclosure.

The method begins with forming 1301 one or more fin structures on a substrate. The resulting fin structures can be formed, for example, in a substrate of any kind (e.g., bulk substrate, XOI, partially fabricated growth structure, etc) using any suitable fin formation techniques (e.g., photolithography, epitaxy, etc) as previously explained. The method continues with depositing 1303 sacrificial gate material over the fin structures. In one example case, the fins are formed on a silicon substrate, and the sacrificial gate material is polysilicon. Other suitable sacrificial gate materials include silicon nitride and silicon carbide. Many others can be used as will be appreciated, depending on the material systems being used, the devices being made, and the processes being used.

The method continues with polishing 1305 the sacrificial gate material. The polishing can be carried out, for instance, with CMP and other suitable planarization techniques, such as a spin-on dielectric plus etching or a reverse mask plus etching. A finishing polish can be used if so desired (e.g., combination of etch and CMP). In any such cases, the purpose of the polishing is to eliminate or otherwise substantially minimize topography associated with the fin structures. As previously discussed, the topography is enhanced when STI structures next to the fin structures are recessed. In one example embodiment, the polishing is carried out to achieve a flatness on the nanometer scale such as 50 nm or better, meaning that every point of the planarized surface is a distance of 50 nm or less from a common reference plane (such as the plane that makes the top of the fins). This flatness of the polished sacrificial gate material effectively translates to a similar flatness for features that travel over the fin structure, such as gate surface and gate lines. In one specific example embodiment, the flatness of the polished sacrificial layer and such gate features traveling of the fin structure is in the range of 35 nm or better. In another specific example embodiment, the flatness of the polished sacrificial layer and such gate features traveling of the fin structure is in the range of 20 nm or better. In another specific example embodiment, the flatness of the polished sacrificial layer and such gate features traveling of the fin structure is in the range of 1 nm to 10 nm. In another embodiment, the flatness achieved can be 20% or less of the minimum gate height. For instance, if the minimum gate height (as measured from bottom to top of sacrificial gate material after patterning) is 25 nm, then the flatness of the polished sacrificial layer and such gate features traveling of the fin structure 5 nm (or better). In another such case, if the minimum gate height (as measured from bottom to top of sacrificial material after patterning) is 65 nm, then the flatness of the polished sacrificial layer and such gate features traveling of the fin structure 13 nm (or better). Many other examples will be apparent.

The method continues with patterning 1307 the sacrificial gate material, and forming 1309 source and drain regions of the transistor, such as previously discussed with reference to FIGS. 9 and 10, respectively. As previously explained, this patterning can be carried out from a single depth of focus (DOF), due to the pre-pattering planarization of the sacrificial layer. The source and drain regions can be formed and doped as desired, depending on particulars such as the type of device (e.g., PMOS, NMOS, complementary pairs, etc) and the process flow (e.g., RMG process flow, non-RMG process flow, etc). As used herein, single depth of focus can be achieved even with some variation in the surface flatness (i.e., perfect flatness is not required). In this sense, a single depth of focus is intended to include a narrow range of depth of focus. In one example case, a single DOF is enabled by planarizing the sacrificial gate material to have a flatness of 50 nm or better, where such a flatness is associated with a narrow range of DOF, which range shall be considered a single DOF in accordance with one example embodiment. In a more general sense, a single depth of focus is enabled by planarizing the sacrificial gate material to have a flatness that allows patterning to take place without incurring problems associated with excessive topography, as previously explained. For instance, and as previously explained with respect to polishing 1305, if the flatness achieved by planarizing the sacrificial gate material is 20% or less of the minimum gate height (as measured from bottom to top of sacrificial gate material after patterning), problems associated with excessive topography can be avoided.

The method continues with depositing 1311 an inter-layer dielectric (ILD) and planarizing that deposited material. As previously explained, an optional etch stop layer can be deposited prior to depositing the ILD (e.g., to protect doped source and drain regions during subsequent etching), if so desired. The ILD can be any suitable low dielectric constant material such as an oxide (e.g., $SiO_2$) and may be doped as previously explained. The ILD is planarized down to the upper surface of the sacrificial gate material, thereby removing the hardmask and the etch stop (if applicable). The planarization effectively opens up the sacrificial gate material, so that it can be removed to make way for the gate metal.

The method continues with etching 1313 out the sacrificial gate material, thereby forming a gate trench. Recall that, after removing the sacrificial gate material, the pad oxide can be removed also. An optional high k gate dielectric can be deposited on the gate trench surfaces, and planarized to improve electrical isolation between the gate electrode and the source/drain regions.

The method continues with forming 1315 replacement metal gate, which generally includes deposition of gate metal and polishing to remove any excess. Other gate features, such as work function metal layers and salicide contacts, may also be formed. Any number of suitable gate configurations can be used.

Thus, the FinFET structure described herein can be formed with numerous semiconductor substrates (such as Si, Ge, SiGe/Ge, and III-V material systems). The process flow allows for forming a substantially topography-free sacrificial gate material layer prior to gate patterning, thereby significantly improving gate patterning, as well as reducing gate line edge roughness and difficulty in gate opening in RMG flows.

Numerous embodiments and configurations will be apparent in light of this disclosure. For instance, one example embodiment of the present invention provides a method for fabricating a semiconductor transistor. The method includes forming a fin structure on a substrate, depositing sacrificial gate material over the fin structure, and polishing the sacrificial gate material prior to gate patterning of the sacrificial gate material and transistor formation. In one particular case, the method may further include patterning (from a single depth of focus) the sacrificial gate material in preparation for forming gate, source, and drain regions of the transistor. The method may further include forming the gate, source, and drain regions. The method may further include at least one of depositing an etch stop layer over the gate region, and depositing a dielectric layer over the gate, source, and drain regions. The method may further include planarizing the dielectric layer to open the sacrificial gate material. The method may further include removing the sacrificial gate material from the gate region, thereby forming a gate trench. The method may further include at least one of depositing gate metal into the gate trench, and polishing to remove any excess metal. In another particular case, a plurality of fin structures and transistors are formed on the substrate. In another particular case, the substrate comprises silicon and the sacrificial gate material comprises polysilicon. In another particular case, the transistor is a FinFET device (e.g., double-gate or trigate).

In another embodiment, the method for fabricating semiconductor transistors includes forming a plurality of fin structures on a substrate, depositing sacrificial gate material over the fin structures, polishing the sacrificial gate material prior to gate patterning of the sacrificial gate material and transistor formation so that the sacrificial gate material has a flatness of 10 nm or better, and then patterning (from a single depth of focus) the sacrificial gate material in preparation for forming gate, source, and drain regions of the transistors. The method further includes forming the gate, source, and drain regions, depositing a dielectric layer over the gate, source, and drain regions, and planarizing the dielectric layer to open the sacrificial gate material. The method further includes removing the sacrificial gate material from the gate regions, thereby forming gate trenches, and depositing gate metal into the gate trenches. In one such case, the transistor is a FinFET device.

Another example embodiment provides a semiconductor transistor device. The device includes a fin structure formed on a substrate, and a plane established pre-gate-patterning by a polished sacrificial gate material deposited over the fin structure. The plane defines a single depth of focus used for gate patterning of the sacrificial gate material to provide gate, source and drain regions. In one particular case, the device may further include at least one of a dielectric layer deposited over the gate, source, and drain regions, the dielectric layer having been planarized to open the sacrificial gate material. In one such case, the sacrificial gate material is removed from the gate region to provide a gate trench, and the device further includes gate metal deposited into the gate trench, wherein the gate metal is polished to remove any excess metal. In another particular case, the polished sacrificial gate material is polished to a flatness is 1 nm to 10 nm. In another particular case, a plurality of fin structures and transistors are formed on the substrate. In another particular case, the device includes dielectric material deposited in trenches neighboring the fin structure, the dielectric material having a top surface that is recessed below a top surface of the fin structure. In another particular case, the transistor is a FinFET device. In another particular case, the polished sacrificial gate material is polished to a flatness is 1 nm to 5 nm.

The foregoing description of example embodiments of the invention has been presented for the purposes of illustration and description. It is not intended to be exhaustive or to limit the invention to the precise forms disclosed. Many modifications and variations are possible in light of this disclosure. It is intended that the scope of the invention be limited not by this detailed description, but rather by the claims appended hereto.

What is claimed is:

1. A method for fabricating a semiconductor transistor, comprising:
    forming a fin structure on a substrate;
    depositing sacrificial gate material over the fin structure; and
    polishing the sacrificial gate material, prior to gate patterning of the sacrificial gate material and transistor formation;
    from a single depth of focus, patterning the sacrificial gate material in preparation for forming gate, source, and drain regions of the transistor;
    forming the gate region;
    forming the source and drain regions in at least a portion of the fin structure; and
    depositing dielectric material in trenches neighboring the fin structure, the dielectric material having a top surface that is recessed below a top surface of the fin structure.

2. The method of claim 1 further comprising at least one of:
    depositing an etch stop layer over the gate region; and
    depositing a dielectric layer over the gate, source, and drain regions.

3. The method of claim 2 further comprising:
    planarizing the dielectric layer to open the sacrificial gate material.

4. The method of claim 3 further comprising:
removing the sacrificial gate material from the gate region, thereby forming a gate trench.

5. The method of claim 4 further comprising at least one of:
depositing gate metal into the gate trench; and
polishing to remove any excess metal.

6. The method of claim 1 wherein a plurality of fin structures and transistors are formed on the substrate.

7. The method of claim 1 wherein the substrate comprises silicon and the sacrificial gate material comprises polysilicon.

8. The method of claim 1 wherein the transistor is a FinFET device.

9. A semiconductor transistor device, comprising:
a fin structure formed on a substrate;
a plane established pre-gate-patterning by a polished sacrificial gate material deposited over the fin structure, the plane defining a single depth of focus used for gate patterning of the sacrificial gate material to provide gate, source and drain regions, wherein the source and drain regions are formed in at least a portion of the fin structure; and
dielectric material deposited in trenches neighboring the fin structure, the dielectric material having a top surface that is recessed below a top surface of the fin structure.

10. The device of claim 9 further comprising:
a dielectric layer deposited over the gate, source, and drain regions, the dielectric layer having been planarized to open the sacrificial gate material.

11. The device of claim 10 wherein the sacrificial gate material is removed from the gate region to provide a gate trench, the device further comprising gate metal deposited into the gate trench, wherein the gate metal is polished to remove any excess metal.

12. The device of claim 9 wherein the polished sacrificial gate material is polished to a flatness is 1 nm to 10 nm.

13. The device of claim 9 wherein a plurality of fin structures and transistors are formed on the substrate.

14. The device of claim 9 wherein the transistor is a FinFET device.

15. The device of claim 9 wherein the polished sacrificial gate material is polished to a flatness is 1 nm to 5 nm.

16. A method for fabricating semiconductor transistors, comprising:
forming a plurality of fin structures on a substrate;
depositing sacrificial gate material over the fin structures;
polishing the sacrificial gate material, prior to gate patterning of the sacrificial gate material and transistor formation, so that the sacrificial gate material has a flatness of 10 nm or better;
from a single depth of focus, patterning the sacrificial gate material in preparation for forming gate, source, and drain regions of the transistors, wherein the source and drain regions are formed in at least a portion of the fin structures;
forming the gate, source, and drain regions;
depositing a dielectric layer over the gate, source, and drain regions;
planarizing the dielectric layer to open the sacrificial gate material;
removing the sacrificial gate material from the gate regions, thereby forming gate trenches;
depositing gate metal into the gate trenches; and
depositing dielectric material in trenches neighboring the fin structure, the dielectric material having a top surface that is recessed below a top surface of the fin structure.

17. The method of claim 16 wherein the transistor is a FinFET device.

\* \* \* \* \*